US012592666B2

(12) United States Patent
Siddamurthy et al.

(10) Patent No.: US 12,592,666 B2
(45) Date of Patent: Mar. 31, 2026

(54) METHODS AND SYSTEMS FOR REDUCING A FREQUENCY DRIFT IN A VOLTAGE CONTROLLED OSCILLATOR (VCO)

(71) Applicant: Samsung Electronics Co., Ltd., Suwon-si (KR)

(72) Inventors: Subba Reddy Siddamurthy, Bengaluru (IN); Aswani Aditya Kumar Tadinada, Bengaluru (IN); Venkatasuryam Setty Issa, Bengaluru (IN)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/603,544

(22) Filed: Mar. 13, 2024

(65) Prior Publication Data

US 2024/0322756 A1 Sep. 26, 2024

(30) Foreign Application Priority Data

Mar. 24, 2023 (IN) .............................. 202341021244
Jul. 12, 2023 (IN) .............................. 202341021244

(51) Int. Cl.
| | |
|---|---|
| *H03B 5/04* | (2006.01) |
| *H03L 1/02* | (2006.01) |
| *H03L 7/099* | (2006.01) |

(52) U.S. Cl.
CPC ................. *H03B 5/04* (2013.01); *H03L 1/02* (2013.01); *H03L 1/022* (2013.01); *H03L 7/099* (2013.01); *H03L 7/0995* (2013.01)

(58) Field of Classification Search
CPC ......... H03B 5/04; H03L 7/099; H03L 7/0995; H03L 1/022; H03L 1/02; H03K 3/0315
(Continued)

(56) References Cited

U.S. PATENT DOCUMENTS

| | | | |
|---|---|---|---|
| 5,440,277 | A | 8/1995 | Ewen et al. |
| 7,164,325 | B2 | 1/2007 | Aparin et al. |

(Continued)

FOREIGN PATENT DOCUMENTS

| | | |
|---|---|---|
| CN | 107332557 A | 11/2017 |
| WO | 2009-156793 A1 | 12/2009 |

OTHER PUBLICATIONS

Extended European Search Report, dated Aug. 19, 2024, issued in Euroepan Patent Application No. 24165323.7.
(Continued)

*Primary Examiner* — Arnold M Kinkead

(74) *Attorney, Agent, or Firm* — Harness, Dickey & Pierce, P.L.C.

(57) ABSTRACT

A circuit for reducing a temperature-induced frequency drift in a voltage to current (V2I) converter based voltage-controlled oscillator (VCO) for at least one wide band phase-locked loop (PLL), the circuit includes a V2I resistor node of the V2I converter, the V2I resistor node being at one end of a resistor, the VCO, and a current controlled oscillator (CCO), and the circuit is configured to provide a fixed offset current to the V2I resistor node to cause at least one V2I output current to have a value conversely proportional to absolute temperature (CTAT), the at least one V2I output current being output by the V2I converter, and mirror the at least one V2I output current to the CCO to reduce the temperature-induced frequency drift at a lower frequency band of the VCO.

20 Claims, 4 Drawing Sheets

(58)  Field of Classification Search
     USPC ................................... 331/57, 176, 1 R, 182
     See application file for complete search history.

(56)                  References Cited

U.S. PATENT DOCUMENTS

| | | | |
|---|---|---|---|
| 7,872,541 | B2 | 1/2011 | McCorquodale et al. |
| 8,421,542 | B2 | 4/2013 | Romano et al. |
| 9,337,855 | B2 | 5/2016 | Saripalli et al. |
| 2005/0128017 | A1 | 6/2005 | Meltzer |
| 2007/0159264 | A1 | 7/2007 | Jung et al. |
| 2008/0150641 | A1 | 6/2008 | Costa et al. |
| 2009/0033428 | A1 | 2/2009 | Karri |
| 2011/0316595 | A1 | 12/2011 | Bolton |
| 2013/0106476 | A1 | 5/2013 | Joubert et al. |
| 2014/0266472 | A1 | 9/2014 | Waldrip et al. |
| 2015/0180486 | A1 | 6/2015 | Shanan et al. |
| 2015/0263741 | A1 | 9/2015 | Li |
| 2017/0255220 | A1 | 9/2017 | Sivakumar et al. |
| 2020/0083847 | A1 | 3/2020 | Seetharam et al. |
| 2021/0263547 | A1 | 8/2021 | Shen et al. |

OTHER PUBLICATIONS

Souliotis, G. et al. "Temperature compensated ring oscillator based VCO" International Journal of Electronics and Communications, (Mar. 24, 2022).

in → V2I (202) → IDAC (204) → CCO (206) → out

400

Provide a fixed offset current to the V2I resistor node of the V2I circuit, wherein at least one conversely proportional to absolute temperature (CTAT) behavior is generated to at least one V2I output current

402

Mirror at least one V2I output current to the CCO to reduce the frequency drift at lower band of oscillator frequency

404

METHODS AND SYSTEMS FOR REDUCING A FREQUENCY DRIFT IN A VOLTAGE CONTROLLED OSCILLATOR (VCO)

CROSS-REFERENCE TO RELATED APPLICATION

This application is based on and claims priority under 35 U.S.C. § 119 to Indian patent application Ser. No. 20/234, 1021244, filed on Jul. 12, 2023 in the Indian Intellectual Property Office, and Indian Provisional Application No. 20/234,1021244, filed on Mar. 24, 2023 in the Indian Intellectual Property Office, the disclosures of each of which are hereby incorporated by reference herein in their entireties.

TECHNICAL FIELD

Embodiments disclosed herein relate to reducing a frequency drift in a voltage to current converter (V2I) based VCO by introducing a conversely proportional to absolute temperature (CTAT) in a V2I output current to a ring oscillator (RO).

BACKGROUND

Wireless communication devices may be configured to operate in an assigned frequency band within an allocated spectrum of available frequency bands. The allocated spectrum may be a contiguous frequency span or may comprise multiple disjoint frequency spans. The frequency assignment may be dynamic and may change during the course of communications.

Wireless communication devices may incorporate a Voltage Controlled Oscillator (VCO) that may be tuned across a tuning range that enables the device to operate in any assigned frequency band from the multiple frequency bands. The VCO may be incorporated into a frequency synthesizer that may include a phase locked loop (PLL) that is configured to maintain a control voltage of the VCO at a value that tunes the VCO output frequency to a desired frequency.

As the frequency response of the VCO varies over an operating temperature range, the PLL provides different control voltage values over various temperatures to achieve the desired VCO frequency. The change in a free running VCO output frequency for a provided voltage value may be referred to a temperature drift. A large VCO temperature drift may increase the range of control voltage used to maintain the desired VCO output frequency over a temperature range.

Wide band PLLs suffer from frequency drift issues with changes in temperature. Typically, frequency drift issues may be solved using part of current for a Ring oscillator (RO) from temperature compensation circuits (such as proportional to absolute temperature (PTAT)/CTAT). However, this may not be suitable for wide band PLLs. Also, absolute VCO frequency drift may be constant across all the frequencies of operation. Because of this, at the lower side of VCO frequency band, frequency correction range with control voltage may be limited compared to the higher side of the bands due to low signal gain ($K_{vco}$). Therefore, to correct VCO frequency drift at lower frequency bands, the frequency drift has been reduced with temperature compensation and the signal gain has been increased.

FIG. 1 depicts an example scenario, wherein the resistor-based voltage to current converter (V2I) controls current, ICCO, of a current controlled ring oscillator (CCO). As illustrated, $IV2I=Vctrl/R$, $ICCO=IV2I*K_{IDAC}$, wherein $K_{IDAC}$ is a V2I IDAC (current of a digital to analog converter) gain. VCO small signal gain=$K_{ICCO}*K_{IDAC}/R$, wherein $K_{ICCO}$ is current controlled oscillator (CCO) gain. $K_{ICCO}=2\pi(\Delta f_{VCO}/\Delta I_{CCO})$. The $\Delta f_{VCO}$ may represent a change in oscillation frequency of the VCO. As illustrated in FIG. 1, the resistor may have a negligible temperature co-efficient, therefore ICCO may have an approximate negligible temperature co-efficient. Therefore, the voltage to frequency gain $K_{VCO}$ of the VCO should be high enough to correct the drift in frequency of the oscillator with temperature.

Hence, at lower technology nodes, the available range of V control voltage (Vctrl) may be reduced due to supply scaling.

SUMMARY

In embodiments, a temperature coefficient for the ICCO current in an opposite direction to the temperature coefficient of the CCO frequency is provided to prevent or reduce the occurrence of Vctrl reaching undesirable range. Embodiments disclose methods and systems for reducing a temperature-induced frequency drift in a voltage to current converter (V2I) based voltage-controlled oscillator (VCO) unit.

Embodiments disclose methods and systems for introducing temperature behavior in output current of V2I architecture with output current connected to a ring oscillator (RO).

Embodiments disclose methods and systems for correcting the temperature-induced frequency drift of the RO by extending the fine tune frequency correction range.

Accordingly, embodiments herein provide a circuit for reducing a temperature-induced frequency drift in a voltage to current (V2I) converter based voltage-controlled oscillator (VCO) for at least one wide band phase-locked loop (PLL), the circuit includes a V2I resistor node of the V2I converter, the V2I resistor node being at one end of a resistor, the VCO, and a current controlled oscillator (CCO), and the circuit is configured to provide a fixed offset current to the V2I resistor node to cause at least one V2I output current to have a value conversely proportional to absolute temperature (CTAT), the at least one V2I output current being output by the V2I converter, and mirror the at least one V2I output current to the CCO to reduce the temperature-induced frequency drift at a lower frequency band of the VCO.

Also, embodiments herein provide a method for reducing a temperature-induced frequency drift in a voltage to current (V2I) converter based voltage-controlled oscillator (VCO) for at least one wide band phase-locked loop (PLL), the V2I converter including a V2I resistor node at one end of a resistor, the V2I converter being connected to a current controlled oscillator (CCO), and the method includes providing a fixed offset current to the V2I resistor node to cause at least one V2I output current to have a value conversely proportional to absolute temperature (CTAT), the at least one V2I output current being output by the V2I converter, and mirroring the at least one V2I output current to the CCO to reduce the temperature-induced frequency drift at a lower frequency band of the VCO.

These and other aspects of embodiments herein will be better appreciated and understood when considered in conjunction with the following description and the accompanying drawings. It should be understood, however, that the following descriptions, while indicating embodiments and numerous specific details thereof, are given by way of illustration and not of limitation. Many changes and modifications may be made within the scope of embodiments herein without departing from the spirit thereof, and embodiments herein include all such modifications.

BRIEF DESCRIPTION OF FIGURES

Embodiments disclosed herein are illustrated in the accompanying drawings, throughout which like reference letters indicate corresponding parts in the various figures. Embodiments herein will be better understood from the following description with reference to the drawings, in which.

DETAILED DESCRIPTION

Embodiments herein and the various features and advantageous details thereof are explained more fully with reference to the non-limiting examples that are illustrated in the accompanying drawings and detailed in the following description. Descriptions of well-known components and processing techniques are omitted so as to not unnecessarily obscure embodiments herein. The examples used herein are intended merely to facilitate an understanding of ways in which embodiments herein may be practiced and to further enable those of skill in the art to practice embodiments herein. Accordingly, the examples should not be construed as limiting the scope of embodiments herein.

Figure 1:
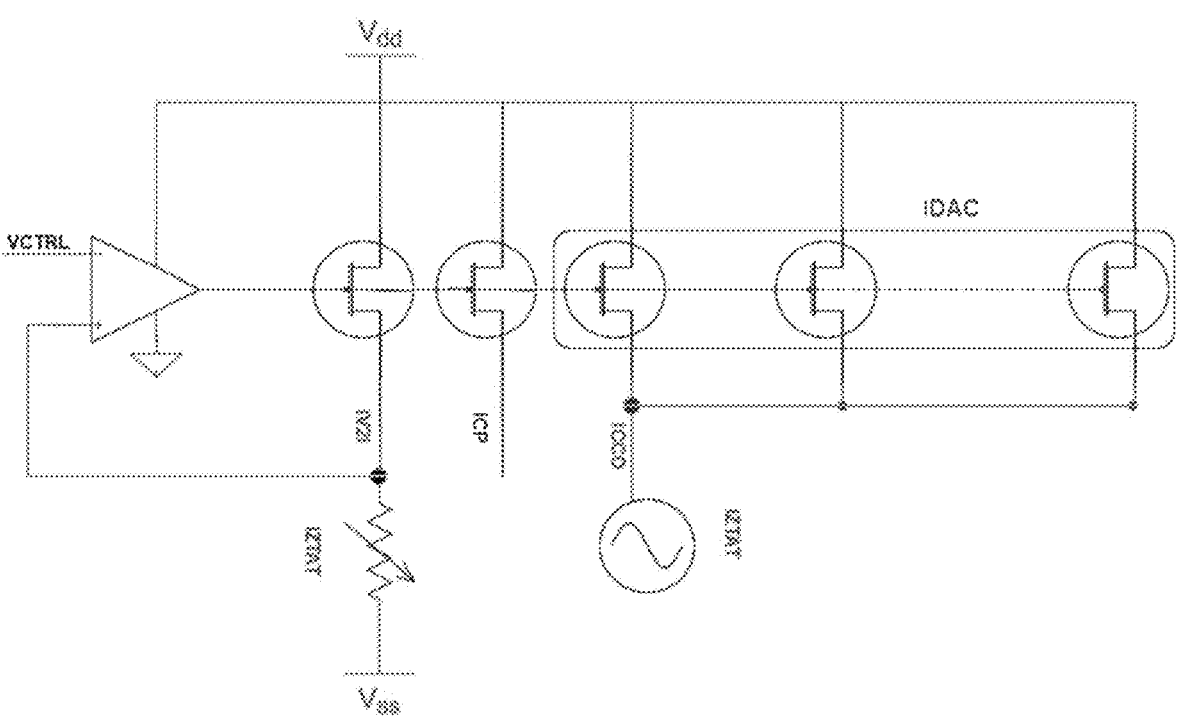
FIG. 1 depicts an example scenario, wherein the resistor-based voltage to current converter controls current, ICCO, of current controlled ring oscillator (CCO), according to the prior art.
Figure 2:
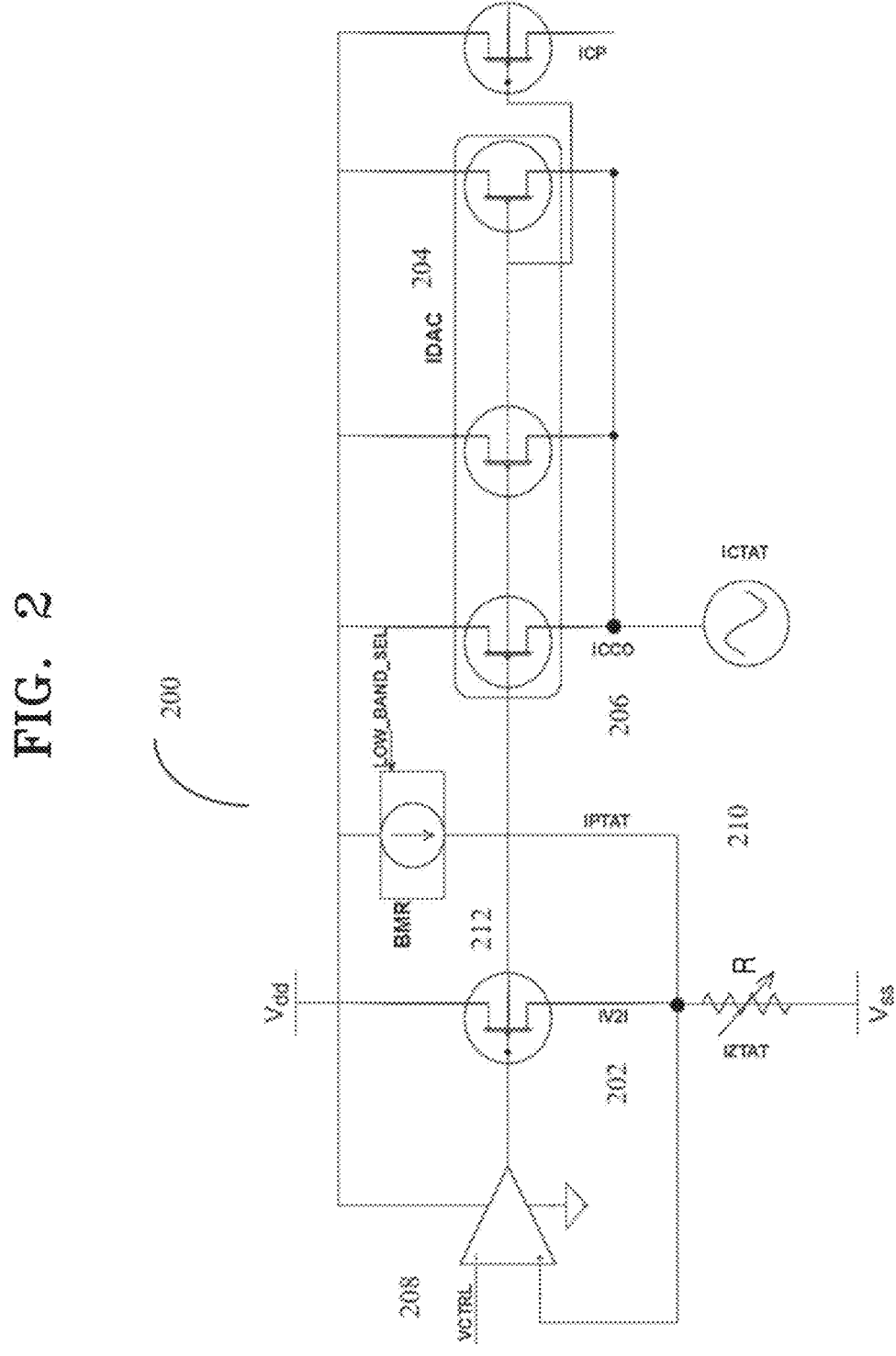
FIG. 2 depict an example diagram of a circuit to reduce a frequency drift in a voltage to current converter (V2I) based VCO by introducing a temperature behavior in CCO current, according to embodiments as disclosed herein.
Figure 3:
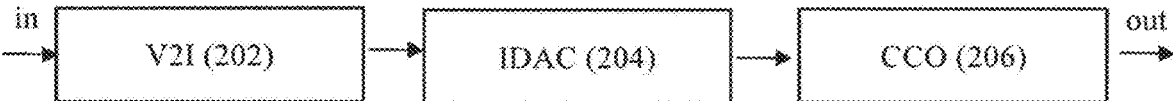
FIG. 3 depict an example block diagram of a system to reduce the frequency drift in the V2I based VCO architecture, according to embodiments as disclosed herein.
Figure 4:
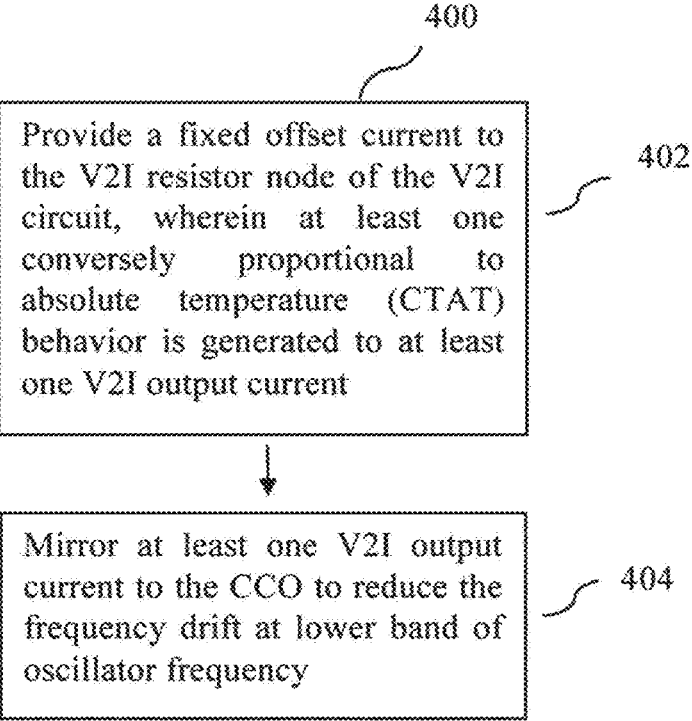
FIG. 4 is a flow diagram depicting a method for reducing a frequency drift with temperature in a voltage to current converter (V2I) based VCO architecture for at least one wide band phase-locked loop (PLL), according to embodiments as disclosed herein.

Embodiments herein provide a circuit 200 for reducing a temperature-induced frequency drift in a voltage to current converter (V2I) based VCO architecture for at least one wide band phase-locked loop (PLL). The circuit may be configured to provide a fixed offset current to the resistor node of the V2I circuit, wherein CTAT behavior may be introduced on the V2I out current. According to embodiments, the introduction of CTAT behavior may include causing the V2I output current to have a value conversely proportional to a temperature of the circuit 200. Further, V2I output current may be mirrored to a current controlled oscillator unit (CCO) to reduce the frequency drift at lower bands of the oscillator frequency. Referring now to the drawings, and more particularly to FIGS. 2 through 4, where similar reference characters denote corresponding features consistently throughout the figures, there are shown at least one example.

Embodiments herein disclose the circuit 200, wherein the circuit may force a fixed offset PTAT current to the resistor node of V2I architecture to provide CTAT behavior to the at least one V2I output current. According to embodiments, the fixed offset PTAT current may have a value proportional to the temperature of the circuit 200. Further, embodiments disclose selectively tuning a PTAT branch at the lower band of oscillator frequency without affecting loop dynamics of the wide band PLL and forcing fixed PTAT current to the resistor node to extend the fine tune frequency correction range of the VCO. Selectively turning on the PTAT branch may be performed only at a lower band of PLL operation where fine tune correction of VCO is limited due to low signal gain.

FIG. 2 depicts an example diagram of a circuit to reduce a frequency drift in a voltage to current converter (V2I) based VCO by introducing a temperature behavior in CCO current, according to embodiments as disclosed herein.

As depicted in FIG. 2, the circuit 200 may be configured with a voltage control pin (Vctrl) (input) connected to a voltage to current converter (V2I) 202 (based on a voltage-controlled oscillator (VCO) 210), a current controlled oscillator (CCO) 206 (also referred to herein as the CCO circuit 206 or the CCO configuration 206) to the IDAC 204 (also referred to herein as the IDAC configuration 204). As depicted, VCO 210 (also referred to herein as the VCO architecture 210) is an electronic oscillator with the oscillation frequency controlled by the Vctrl 208 (e.g., an operational amplifier). The instantaneous oscillation frequency of the VCO 210 may depend on an applied input voltage. The VCO 210 may be used for frequency modulation (FM) or phase modulation (PM) by applying a modulating signal to the control input. Hence, the VCO 210 forms an integral part of phase locked loop (PLL) signal.

As depicted, the V2I converter 202 of the electronic circuit 200 may produce current as the output for the applied voltage. V2I may be used to create a current which is corresponding or proportional to the definite voltage, which may change the carrier of electrical data from voltage to current.

Hence, on supplying voltage as input to a circuit which comprises a resistor, a proportional current may commence to flow through it. The value of a resistor may decide the current flow in the circuit to perform a simple voltage to current conversion for a linear circuit.

The phase locked loop (PLL) is the circuit where the voltage or voltage driven oscillator may be constantly adjusted to match the frequency of the input signal which may generate multiple frequencies. Phase differences generated in the PLL may be constant with the generated frequency. Frequency drift may occur in the circuit which results in unintended and arbitrary offset of the oscillator from its nominal frequency, causing illegal interferences in the adjacent channels. It may occur due to change in temperature or with the bias current to the oscillator.

Therefore, the frequency drift with change in temperature of the V2I convertor 202 (also referred to herein as the V2I 202) based on VCO architecture 210 may be reduced based on the configured circuit 200. The circuit may be configured to apply a fixed offset current to the V2I resistor node, at the lower frequency of the circuit, wherein the CTAT behavior may be introduced to the V2I output. Further, the fixed offset current may include, but not limited to, PTAT, CTAT and constant with absolute temperature (ZTAT) based on the type of temperature-induced frequency behavior of the VCO. The circuit 200 may be configured to mirror the generated V2I output current with the CTAT behavior into CCO to reduce the frequency drift. Mirroring may be performed using IDAC configuration 204 to the CCO 206 of the circuit to reduce the frequency drift at the lower band of the oscillator frequency. The IDAC configuration 204 may be configured to mirror the V2I output current to CCO. Also, the fixed offset PTAT current forced into the V2I resistor node may extend a fine tune frequency correction range of the VCO.

In embodiments, the fixed offset PTAT current may be forced (e.g., applied) into the V2I resistor node of the circuit 200. The negative feedback of the V2I amplifier (e.g., the Vctrl 208 included in the V2I converter) may maintain the current (e.g., the resistor current) through the resistor at the end of the V2I resistor node, which is proportional to Vctrl/R. Further, as the "R" resistor has a negligible temperature co-efficient, the current (e.g., the resistor current) through the resistor (e.g., with negative feedback) may be always in ZTAT nature.

By Kirchoff's current law (KCL), current through the resistor is the sum of offset current PTAT from a beta-multiplier reference (BMR) 212 and a V2I P-type metal-oxide-semiconductor (PMOS) current. When activating the PMOS, by lowering the voltage on the gate, the resulting circuit may be configured to allow the conduction of electron holes between the source and drain, turning (e.g., switching) the circuit "ON". The BMR 212 is a current reference, described by NMOS and PMOS current mirroring. As, the resistor current is always ZTAT co-efficient (negative feedback), the V2I PMOS branch current may be of CTAT nature, which may cancel out the PTAT behavior of the offset current. According to embodiments, According to embodiments, the voltage on the gate of the PMOS may be lowered in response to a control signal from a controller. According to embodiments, the controller may output the control signal in response to determining that the desired frequency (e.g., at which the VCO is configured to oscillate) falls within the lower frequency band of the VCO (e.g., based on a sensed frequency, input indicating the desired frequency, etc.). According to embodiments, the fixed offset current may be configured to have a value that is PTAT by increasing a voltage to frequency gain ($K_{VCO}$) of the VCO. According to embodiments, the fixed offset current is configured to have a value that is PTAT and induces opposite of the frequency drift in a current of the CCO.

Further, in embodiments, the circuit 200 may be configured to reduce the temperature-induced frequency drift in the VCO architecture (V2I and CCO) 210 of the wide band PLL signal. The circuit 200 may be configured by applying a fixed offset current in the V2I resistor node at a lower frequency to introduce CTAT behavior in the V2I output (e.g., to cause the V2I converter output current to have a value that is CTAT). The fixed offset current may be PTAT, CTAT, or ZTAT (e.g., have a value that is PTAT, CTAT or ZTAT) based on the type of frequency behavior with temperature of the VCO 210. Further, the V2I output current with the CTAT nature may be mirrored into the CCO circuit 206 to reduce the frequency drift, forcing the fixed offset PTAT current into the V2I resistor node may extend the fine tune frequency correction range of VCO 210. According to embodiments, the fixed offset current may be generated based on a control signal from the controller. According to embodiments, the control signal may be based on a determined characteristic (e.g., magnitude, etc.) of temperature-induced frequency drift in the VCO 210 (e.g., determined based on a temperature sensed by a temperature sensor, received in an input signal, etc.)). According to embodiments, the control signal may be determined such that the resulting fixed offset current will cause the V2I converter output current to be CTAT and correct for the frequency drift in the VCO 210.

In embodiments, the circuit 200 may be configured to reduce the frequency drift with temperature in the VCO architecture (V2I and CCO) 210 of the wide band PLL signal. The circuit 200 may be configured by applying the fixed offset current in the V2I resistor node at a lower frequency to introduce CTAT behavior in the V2I output current.

The fixed offset current may be, but not limited to, PTAT, CTAT, ZTAT and the like, based on the type of frequency behavior with temperature of the VCO 210. Mirroring of V2I output current with CTAT behavior may be performed in the CCO 206 to reduce the frequency drift. Fixed offset PTAT current may be forced into the V2I resistor node to extend the fine frequency correction range of the VCO. Therefore, selectively tuning the PTAT branch at a lower frequency band may reduce the frequency drift with temperature without affecting loop dynamics in the wide band PLL signals. Selective turning on the PTAT branch may be performed only at a lower band of PLL operation where fine tune correction of VCO is limited due to low signal gain.

According to embodiments, the output signal of the CCO 206 in which the temperature-induced frequency drift has been removed and/or reduced may be used to generate a CCO output signal of a desired frequency. According to embodiments, the CCO output signal may be combined with data (e.g., application data in a baseband signal) to generate an outgoing communication signal for transmission (e.g., a radio frequency (RF) signal). According to embodiments, the CCO output signal may be combined with data (e.g., application data in an RF signal) to generate a received communication signal (e.g., a baseband signal) to be provided to a processor.

FIG. 3 depict an example block diagram of a system to reduce the frequency drift in the V2I based VCO architecture, according to embodiments as disclosed herein. The system may include the V2I converter 202, the IDAC 204 and/or the CCO 206 discussed above in connection with FIG. 2.

As depicted in the diagram, the circuit 200 may be configured to force (e.g., apply) a fixed offset current to the resistor node of V2I converter 202, wherein CTAT behavior may be introduced to the V2I output current. The V2I 202 and the CCO 206 may be combined to form the VCO architecture 210. Further, the V2I output current may be provided to the IDAC 204, which may mirror the V2I output current to be provided to the CCO 206 to reduce the frequency drift at the lower band of the oscillator frequency.

Further, embodiments disclose selectively turning on the PTAT branch at the lower band of oscillator frequency without affecting loop dynamics of the wide band PLL and forcing the fixed PTAT current to the resistor node to extend the fine tune frequency correction range of the VCO 210. Selective turning on the PTAT branch may be performed only at the lower band of PLL operation where fine tune correction of VCO is limited due to low signal gain.

Further, the frequency drift with change in temperature of the V2I 202 convertor based on the VCO 210 may be reduced based on the configured circuit. The circuit may be configured to apply a fixed offset current to the V2I resistor node, at the lower frequency of the circuit, wherein the CTAT behavior may be introduced to the V2I output. Further, the fixed offset current may include, but not limited to, PTAT, CTAT and/or ZTAT based on the type of VCO frequency behavior with temperature. The circuit 200 may be configured to mirror the generated V2I output current with the CTAT behavior into the CCO to reduce the frequency drift.

Mirroring may be performed using the IDAC configuration 204 to the CCO 206 of the circuit 200 to reduce the frequency drift at the lower band of the oscillator frequency. The IDAC configuration 204 may be configured to mirror the V2I output current of the circuit to the CCO configuration 206. Also, the fixed offset PTAT current forced into the V2I resistor node may extend the fine tune frequency correction range of the VCO 210.

FIG. 4 is a flow diagram depicting a method for reducing a frequency drift with temperature in a voltage to current converter (V2I) based VCO architecture for at least one wide band phase-locked loop (PLL), according to embodiments as disclosed herein. According to embodiments, the method may be implemented using the circuit 200 discussed in connection with FIG. 2, and/or the system discussed in connection with FIG. 3. Operation 402 includes providing a fixed offset current to the V2I resistor node of the V2I circuit, wherein at least one conversely proportional to absolute temperature (CTAT) behavior is generated to at least one V2I output current. Operation 404 includes mirroring at least one V2I output current to the CCO to reduce the frequency drift at a lower band of oscillator frequency. The various actions, acts, blocks, operations, or the like in the method and the flow diagram 400 may be performed in the order presented, in a different order, simultaneously or contemporaneously. Further, in embodiments, some of the actions, acts, blocks, operations, or the like may be omitted, added, modified, skipped, or the like without departing from the scope of the inventive concepts.

Embodiments disclosed herein may be implemented through at least one software program running on at least one hardware device and performing network management functions to control the elements. The elements may be at least one of a hardware device, or a combination of hardware device and software module.

Conventional devices and methods for generating an output frequency input control voltages to a VCO that vary according to temperature (e.g., the temperature of the VCO) in order to compensate for temperature-induced frequency drift of the VCO. However, this approach is insufficiently effective for use in wide-band PLLs, particularly in instances in which a desired frequency falls within a lower frequency band of the VCO. Accordingly, the conventional devices and methods are unable to sufficiently prevent or reduce the temperature-induced frequency drift of the VCO resulting in excessive interference in adjacent frequency bands and/or reduction in communication signal quality (e.g., due to interference with adjacent bands, etc.).

However, according to embodiments, improved devices and methods are provided for generating an output frequency. For example, the improved devices and methods cause a temperature-varying current to be provided to the VCO that corrects for and/or reduces the temperature-induced frequency drift of the VCO. Accordingly, the improved devices and methods overcome the deficiencies of the conventional devices and methods to at least reduce interference in adjacent frequency bands and/or improve communication signal quality.

According to embodiments, operations described herein as being performed by the controller, the processor, circuit 200, the V2I converter 202, the IDAC 204, the CCO 206, the Vctrl 208, the VCO 210 and/or the BMR 212 may be performed by processing circuitry. The term 'processing circuitry,' as used in the present disclosure, may refer to, for example, hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The various operations of methods described above may be performed by any suitable device capable of performing the operations, such as the processing circuitry discussed above. For example, as discussed above, the operations of methods described above may be performed by various hardware and/or software implemented in some form of hardware (e.g., processor, ASIC, etc.).

The software may comprise an ordered listing of executable instructions for implementing logical functions, and may be embodied in any "processor-readable medium" for use by or in connection with an instruction execution system, apparatus, or device, such as a single or multiple-core processor or processor-containing system.

The blocks or operations of a method or algorithm and functions described in connection with embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

It will be understood that when an element is referred to as being "connected" or "coupled" to another element, it may be directly connected or coupled to the other element or intervening elements may be present. As used herein the term "and/or" includes any and all combinations of one or more of the associated listed items.

The foregoing description of the specific examples will so fully reveal the general nature of embodiments herein that others may, by applying current knowledge, readily modify and/or adapt for various applications such specific examples without departing from the generic concept, and, therefore, such adaptations and modifications should and are intended to be comprehended within the meaning and range of equivalents of embodiments. It is to be understood that the phraseology or terminology employed herein is for the purpose of description and not of limitation. Therefore, while embodiments herein have been described in terms of at least one example, those skilled in the art will recognize that embodiments herein may be practiced with modification within the spirit and scope of embodiments as described herein.

We claim:
1. A circuit for reducing a temperature-induced frequency drift in a voltage to current (V2I) converter based voltage-controlled oscillator (VCO) for at least one wide band phase-locked loop (PLL), the circuit comprising:
   a V2I resistor node of the V2I converter, the V2I resistor node being at one end of a resistor; and
   a current controlled oscillator (CCO),
   wherein
      a first portion of the circuit is configured to provide a fixed offset current to the V2I resistor node to cause at least one V2I output current to have a value conversely proportional to absolute temperature (CTAT), the at least one V2I output current being output by the V2I converter, and a second portion of the circuit is configured to mirror the at least one V2I output current to the CCO to reduce the temperature-induced frequency drift at a lower frequency band of the VCO.

2. The circuit as claimed in claim 1, wherein the fixed offset current is based on a type of temperature-induced frequency behavior of the VCO, the fixed offset current having a value that is at least one of proportional to absolute temperature (PTAT), CTAT or constant with absolute temperature (ZTAT).

3. The circuit as claimed in claim 1, wherein the fixed offset current has a value that is PTAT and induces an opposite of the temperature-induced frequency drift in a current of the CCO.

4. The circuit as claimed in claim 1, wherein the circuit is configured to provide the fixed offset current having a value that is PTAT by increasing a voltage to frequency gain (KVCO) of the VCO.

5. The circuit as claimed in claim 1, wherein
the fixed offset current has a value that is PTAT; and
the circuit is configured to selectively turn on a PTAT branch based on the VCO being configured to oscillate at the lower frequency band without affecting loop dynamics of the at least one wide band PLL.

6. The circuit as claimed in claim 1, wherein the V2I converter includes an amplifier, negative feedback of the amplifier maintaining a resistor current through the resistor, and the resistor current being proportional to an input voltage for controlling the circuit.

7. The circuit as claimed in claim 1, wherein the resistor has a negligible temperature co-efficient with negative feedback of an amplifier of the V2I converter, a resistor current through the V2I resistor node having a value that is ZTAT.

8. The circuit as claimed in claim 2, wherein the value of the fixed offset current is PTAT and induces an opposite of the temperature-induced frequency drift in a current of the CCO.

9. The circuit as claimed in claim 2, wherein the circuit is configured to provide the fixed offset current having the value that is PTAT by increasing a voltage to frequency gain (KVCO) of the VCO.

10. The circuit as claimed in claim 2, wherein
the value of the fixed offset current is PTAT; and
the circuit is configured to selectively turn on a PTAT branch based on the VCO being configured to oscillate at the lower frequency band without affecting loop dynamics of the at least one wide band PLL.

11. The circuit as claimed in claim 2, wherein the V2I converter includes an amplifier, negative feedback of the amplifier maintaining a resistor current through the resistor, and the resistor current being proportional to an input voltage for controlling the circuit.

12. The circuit as claimed in claim 2, wherein the resistor has a negligible temperature co-efficient with negative feedback of an amplifier of the V2I converter, a resistor current through the V2I resistor node having a value that is ZTAT.

13. A method for reducing a temperature-induced frequency drift in a voltage to current (V2I) converter based voltage-controlled oscillator (VCO) for at least one wide band phase-locked loop (PLL), the VCO including the V2I converter and a current controlled oscillator (CCO), the V2I converter including a V2I resistor node at one end of a resistor, the V2I converter being connected to the CCO, and the method comprising:
providing, by a first portion of a circuit, a fixed offset current to the V2I resistor node to cause at least one V2I output current to have a value conversely proportional to absolute temperature (CTAT), the at least one V2I output current being output by the V2I converter; and
mirroring, by a second portion of the circuit, the at least one V2I output current to the CCO to reduce the temperature-induced frequency drift at a lower frequency band of the VCO.

14. The method as claimed in claim 13, wherein the fixed offset current is based on a type of temperature-induced frequency behavior of the VCO, the fixed offset current having a value that is at least one of proportional to absolute temperature (PTAT), CTAT or constant with absolute temperature (ZTAT).

15. The method as claimed in claim 13, wherein the fixed offset current has a value that is PTAT and induces an opposite of the temperature-induced frequency drift in a current of the CCO.

16. The method as claimed in claim 13, wherein the providing provides the fixed offset current having a value that is PTAT by increasing a voltage to frequency gain (KVCO) of the VCO.

17. The method as claimed in claim 13, wherein
the fixed offset current has a value that is PTAT; and
the method further comprises selectively applying a CTAT current value to the V2I resistor node based on whether the VCO is configured to oscillate at the lower frequency band.

18. The method as claimed in claim 14, wherein the value of the fixed offset current is PTAT and induces an opposite of the temperature-induced frequency drift in a current of the CCO.

19. The method as claimed in claim 14, wherein the providing provides the fixed offset current having the value that is PTAT by increasing a voltage to frequency gain (KVCO) of the VCO.

20. The method as claimed in claim 14, wherein
the value of the fixed offset current is PTAT; and
the method further comprises selectively applying a CTAT current value to the V2I resistor node based on whether the VCO is configured to oscillate at the lower frequency band.

* * * * *